(12) United States Patent
Pendse

(10) Patent No.: US 8,076,232 B2
(45) Date of Patent: Dec. 13, 2011

(54) SEMICONDUCTOR DEVICE AND METHOD OF FORMING COMPOSITE BUMP-ON-LEAD INTERCONNECTION

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 84 days.

(21) Appl. No.: 12/562,414

(22) Filed: Sep. 18, 2009

(65) Prior Publication Data
US 2010/0007019 A1 Jan. 14, 2010

Related U.S. Application Data

(63) Continuation-in-part of application No. 12/062,293, filed on Apr. 3, 2008, now Pat. No. 7,700,407.

(51) Int. Cl.
*H01L 21/44* (2006.01)
(52) U.S. Cl. ........ 438/612; 438/613; 438/615; 257/734; 257/737; 257/778; 257/E23.021
(58) Field of Classification Search .................. 438/107, 438/108, 612–615; 257/734, 737, 778, E23.021
See application file for complete search history.

(56) References Cited

U.S. PATENT DOCUMENTS

| | | | |
|---|---|---|---|
| 5,378,859 A | 1/1995 | Shirasaki et al. |
| 5,386,624 A | 2/1995 | George et al. |
| 5,434,410 A | 7/1995 | Kulwicki |
| 5,519,580 A | 5/1996 | Natarajan et al. |
| 5,650,595 A | 7/1997 | Bentlage et al. |
| 5,710,071 A | 1/1998 | Beddingfield et al. |
| 5,844,782 A | 12/1998 | Fukasawa |
| 5,869,886 A | 2/1999 | Tokuno |
| 5,872,399 A | 2/1999 | Lee |
| 5,915,169 A | 6/1999 | Heo |
| 6,201,305 B1 | 3/2001 | Darveaux et al. |
| 6,218,630 B1 | 4/2001 | Takigami |
| 6,228,466 B1 | 5/2001 | Tsukada et al. |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,571 B1 | 1/2002 | Capote et al. |
| 6,383,916 B1 | 5/2002 | Lin |
| 6,396,707 B1 | 5/2002 | Huang et al. |
| 6,409,073 B1 | 6/2002 | Kaskoun et al. |

(Continued)

FOREIGN PATENT DOCUMENTS

JP 5-28037 4/1993
(Continued)

*Primary Examiner* — Hsien Ming Lee
(74) *Attorney, Agent, or Firm* — Robert D. Atkins; Patent Law Group

(57) ABSTRACT

A semiconductor device has a semiconductor die mounted to a substrate with a plurality of composite interconnects formed between interconnect sites on the substrate and bump pads on the die. The interconnect sites are part of traces formed on the substrate. The interconnect site has a width between 1.0 and 1.2 times a width of the trace. The composite interconnect is tapered. The composite interconnects have a fusible portion connected to the interconnect site and non-fusible portion connected to the bump pad. The non-fusible portion can be gold, copper, nickel, lead solder, or lead-tin alloy. The fusible portion can be tin, lead-free alloy, tin-silver alloy, tin-silver-copper alloy, tin-silver-indium alloy, eutectic solder, or other tin alloys with silver, copper, or lead. An underfill material is deposited between the semiconductor die and substrate. A finish such as Cu-OSP can be formed over the substrate.

29 Claims, 12 Drawing Sheets

U.S. PATENT DOCUMENTS

| | | |
|---|---|---|
| 6,441,316 B1 | 8/2002 | Kusui |
| 6,448,665 B1 | 9/2002 | Nakazawa et al. |
| 6,458,622 B1 | 10/2002 | Keser et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,660,560 B2 | 12/2003 | Chaudhuri et al. |
| 6,678,948 B1 | 1/2004 | Benzler et al. |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,809,262 B1 | 10/2004 | Hsu |
| 6,821,878 B2 | 11/2004 | Danvir et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 7,005,585 B2 | 2/2006 | Ishizaki |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,239 B2 | 9/2006 | Pu et al. |
| 7,173,828 B2 | 2/2007 | Lin et al. |
| 7,224,073 B2 | 5/2007 | Kim |
| 7,271,484 B2 | 9/2007 | Reiss et al. |
| 7,294,929 B2 | 11/2007 | Miyazaki |
| 7,317,245 B1 | 1/2008 | Lee et al. |
| 7,405,484 B2 | 7/2008 | Usui et al. |
| 7,436,063 B2 | 10/2008 | Miyata et al. |
| 7,521,284 B2 | 4/2009 | Miranda et al. |
| 7,642,660 B2 | 1/2010 | Tay et al. |
| 7,670,939 B2 | 3/2010 | Topacio et al. |
| 7,671,454 B2 | 3/2010 | Seko |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,932,170 B1 | 4/2011 | Huemoeller et al. |
| 7,947,602 B2 | 5/2011 | Ito et al. |
| 2001/0013423 A1 | 8/2001 | Dalal et al. |
| 2004/0056341 A1 | 3/2004 | Endo et al. |
| 2004/0232562 A1 | 11/2004 | Hortaleza et al. |
| 2005/0103516 A1 | 5/2005 | Kaneyuki |
| 2005/0248037 A1 | 11/2005 | Hung et al. |
| 2006/0131758 A1 | 6/2006 | Dao |
| 2007/0200234 A1 | 8/2007 | Gerber et al. |
| 2008/0093749 A1 | 4/2008 | Gerber et al. |
| 2008/0179740 A1 | 7/2008 | Liao |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2011/0049703 A1 | 3/2011 | Hsu et al. |

FOREIGN PATENT DOCUMENTS

| | | |
|---|---|---|
| JP | 6503687 | 4/1994 |
| JP | 09097791 | 4/1997 |
| JP | 09-097791 | 8/1997 |
| JP | 11145176 A | 5/1999 |
| JP | 11233571 A | 8/1999 |
| JP | 2000349194 A | 12/2000 |
| JP | 2001156203 A | 6/2001 |
| JP | 2002270732 A | 9/2002 |
| JP | 2004165283 A | 6/2004 |
| JP | 2005109187 A | 4/2005 |

SEMICONDUCTOR DEVICE AND METHOD OF FORMING COMPOSITE BUMP-ON-LEAD INTERCONNECTION

CLAIM OF DOMESTIC PRIORITY

The present application is a continuation-in-part of application Ser. No. 12/062,293, filed Apr. 3, 2008, which is a division of application Ser. No. 10/985,654, now U.S. Pat. No. 7,368,817.

FIELD OF THE INVENTION

The present invention relates in general to semiconductor devices and, more particularly, to a semiconductor device and method of forming a composite bump-on-lead interconnection having a non-fusible portion and fusible portion.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In flipchip type packages, a semiconductor die is mounted onto a package substrate with the active side of the die facing the substrate. Conventionally, the interconnection of the circuitry in the die with circuitry in the substrate is made by way of bumps which are attached to an array of interconnect pads on the die, and bonded to a corresponding (complementary) array of interconnect pads (often referred to as "capture pads") on the substrate.

The areal density of electronic features on integrated circuits has increased enormously, and die having a greater density of circuit features also may have a greater density of sites for interconnection with the package substrate.

The package is connected to underlying circuitry, such as a printed circuit board (e.g., a "motherboard") in the device in which it is employed, by way of second level interconnects (e.g., pins) between the package and the underlying circuit. The second level interconnects have a greater pitch than the flipchip interconnects, and so the routing on the substrate conventionally "fans out".

Significant technological advances have enabled construction of fine lines and spaces but, in the conventional arrangement, space between adjacent pads limits the number of traces than can escape from the more inward capture pads in the array. The fan out routing between the capture pads beneath the die and external pins of the package is conventionally formed on multiple metal layers within the package substrate. For a complex interconnect array, substrates having multiple layers may be required to achieve routing between the die pads and second level interconnects on the package.

Multiple layer substrates are expensive and, in conventional flipchip constructs, the substrate alone typically accounts for more than half the package cost (about 60% in some typical instances). The high cost of multilayer substrates has been a factor in limiting proliferation of flipchip technology in mainstream products.

In conventional flipchip constructs, the escape routing pattern typically introduces additional electrical parasitics, because the routing includes short runs of unshielded wiring and vias between wiring layers in the signal transmission path. Electrical parasitics can significantly limit package performance.

The flipchip interconnection can be made by using a melting process to join the bumps, e.g., solder bumps, onto the mating surfaces of the corresponding capture pads and, accordingly, this is known as a "bump-on-capture pad" ("BOC") interconnect. Two features are evident in the BOC design: first, a comparatively large capture pad is required to mate with the bump on the die, and second, an insulating material, typically known as a "solder mask" is required to confine the flow of solder during the interconnection process. The solder mask opening may define the contour of the melted solder at the capture pad ("solder mask defined"), or the solder contour may not be defined by the mask opening ("non-solder mask defined"); in the latter case—as in the example of FIG. 1, described in more detail below—the solder mask opening may be significantly larger than the capture pad. The techniques for defining solder mask openings have wide tolerance ranges. Consequently, for a solder mask defined bump configuration, the capture pad must be large, typically considerably larger than the design size for the mask opening, to ensure that the mask opening will be located on the mating surface of the pad. For a non-solder mask defined bump configuration, the solder mask opening must be larger than the capture pad. The width of capture pads (or diameter, for circular pads) is typically about the same as the ball or bump diameter, and can be as much as two to four times wider than the trace width. The larger width of the capture pads results in considerable loss of routing space on the top substrate layer. In particular, for example, the "escape routing pitch" is much bigger than the finest trace pitch that the substrate technology can offer. A significant number of pads must be routed on lower substrate layers by means of short stubs and vias, often beneath the footprint of the die, emanating from the pads in question.

FIGS. 1 and 2 show portions 10, 20 of a flipchip package, in diagrammatic sectional views. The partial sectional view in FIG. 1 is taken in a plane parallel to the package substrate surface, along the line 1-1' in FIG. 2. The partial sectional view in FIG. 2 is taken in a plane perpendicular to the package substrate surface, along the line 2-2' in FIG. 1. Certain features are shown as if transparent, but many of the features in FIG. 1 are shown at least partly obscured by overlying features.

Referring now to both FIG. 1 and FIG. 2, a die attach surface of the package substrate includes a metal or layer formed on a dielectric layer over substrate 12. The metal layer is patterned to form leads 13 and capture pads 14. An insulating layer 16, typically termed a "solder mask", covers the die attach surface of the substrate. The solder mask is usually constructed of a photo-definable material, and is patterned by photoresist patterning techniques to leave the mating surfaces of capture pads 14 exposed. Interconnect bumps 15 attached to pads on the active side of die 18 are joined to the mating surfaces of corresponding capture pads 14 on the substrate to form appropriate electrical interconnection between the circuitry on the die and the leads on the substrate. After the reflowed solder is cooled to establish the electrical connection, an underfill material 17 is introduced into the space between die 18 and substrate 12, mechanically stabilizing the interconnects and protecting the features between the die and substrate.

As FIG. 1 shows by way of example, signal escape traces in the upper metal layer of the substrate (leads 13), lead from their respective capture pads 14 across the die edge location, indicated by the broken line 11, and away from the die footprint. In a typical example, the signal traces may have an escape pitch $P_E$ about 112 micrometers (μm). A 30 μm/30 μm design rule is typical for the traces themselves in a configuration as shown in FIG. 1. The traces are nominally 30 μm wide and can be spaced as close together as 30 μm. The capture pads are typically three times greater than the trace width and, accordingly in this example the capture pads have a width (or diameter, as they are roughly circular in this example) nominally 90 μm. And, in this example, the openings in the solder mask are larger than the pads, having a nominal width (diameter) of 135 μm.

FIGS. 1 and 2 show a non-solder mask defined solder contour. As the fusible material of the bumps on the die melt, the molten solder tends to "wet" the metal of the leads and capture pads, and the solder tends to "run out" over any contiguous metal surfaces that are not masked. The solder tends to flow along the contiguous lead 13, and here the solder flow is limited by the solder mask, for example, at location 19 in FIG. 1. A non-solder mask defined solder contour at the pad is apparent in FIG. 2, in which material 29 of bumps 15 is shown as having flowed over the sides of capture pads 14 and down to the surface of the dielectric layer of substrate 12. The non-solder mask defined contour does not limit the flow of solder over the surface and down over the sides of the capture pads, and—unless there is a substantial excess of solder at the pad—the flow of solder is limited by the fact that the dielectric surface of the substrate is typically not wettable by the molten solder. A lower limit on the density of the capture pads in the arrangement shown in FIG. 1 is determined by, among other factors, limits on the capacity of the mask forming technology to make reliable narrow mask structures, and the need to provide mask structures between adjacent mask openings. A lower limit on the escape density is additionally determined by, among other factors, the need for escape lines from more centrally located capture pads to be routed between more peripherally located capture pads.

FIG. 3 shows a solder mask defined solder contour, in a sectional view similar to that in FIG. 2. Die 38 is shown affixed by way of bumps 35 onto the mating surfaces of capture pads 34 formed along with traces or leads 33 by patterning a metal layer on the die attach side of a dielectric layer of substrate 32. After the reflowed solder is cooled to establish the electrical connection, an underfill material 37 is introduced into the space between die 38 and substrate 32, mechanically stabilizing the interconnects and protecting the features between the die and substrate. Here, capture pads 34 are wider than in the example of FIGS. 1 and 2, and the solder mask openings are smaller than the capture pads, so that the solder mask material covers the sides and part of the mating surface each capture pad, as shown at location 39, as well as leads 33. When bumps 35 are brought into contact with the mating surfaces of the respective capture pads 34, and then melted, solder mask material 36 restricts the flow of the molten solder, so that the shapes of the solder contours are defined by the shapes and dimensions of the mask openings over capture pads 34.

SUMMARY OF THE INVENTION

A need exists for interconnects having a high routing density. Accordingly, in one embodiment, the present invention is a method of making a semiconductor device comprising the steps of providing a semiconductor die, providing a substrate, and forming a plurality of traces on the substrate. Each trace has an interconnect site with edges parallel to the trace from a plan view for increasing escape routing density. A plurality of composite interconnects is formed between the interconnect sites and bump pads on the semiconductor die. Each composite interconnect has a non-fusible portion connected to the bump pad on the semiconductor die and fusible portion connected to the interconnect site on the substrate.

In another embodiment, the present invention is a method of making a semiconductor device comprising the steps of providing a semiconductor die, providing a substrate having a trace, and forming a composite interconnect between the trace and a bump pad on the semiconductor die. The composite interconnect has a non-fusible portion connected to the bump pad on the semiconductor die and a fusible portion connected to the trace on the substrate.

In another embodiment, the present invention is a method of making a semiconductor device comprising the steps of providing a semiconductor die, providing a substrate having a trace, and forming a composite bump material over an interconnect site on the trace or a bump pad on the semiconductor die. The composite bump material has a fusible portion and non-fusible portion. The composite bump material is reflowed to form a composite interconnect between the interconnect site on the substrate and bump pad on the semiconductor die.

In another embodiment, the present invention is a semiconductor device comprising a semiconductor die and substrate having a trace. A composite interconnect is formed between an interconnect site on the trace and a bump pad on the semiconductor die. The composite interconnect has a non-fusible portion connected to the bump pad and fusible portion connected to the trace.

DETAILED DESCRIPTION OF THE DRAWINGS

Figure 1:
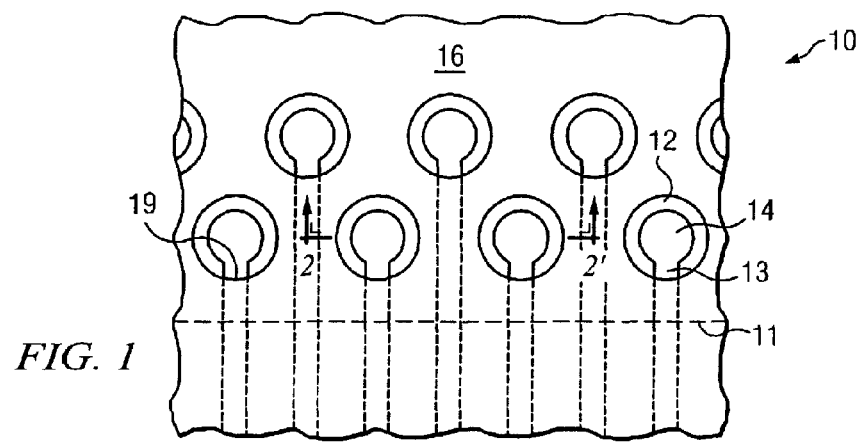
FIG. 1 is a diagrammatic sketch of a portion of a conventional bump-on-capture pad flipchip interconnection, in a sectional view parallel to the plane of the package substrate surface.
Figure 2:
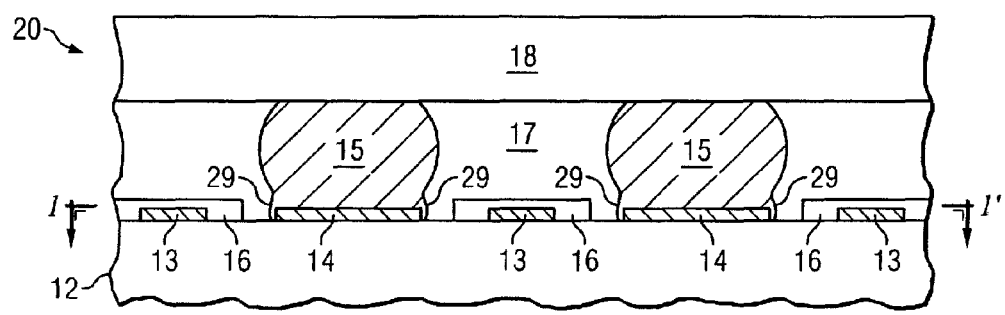
FIG. 2 is a diagrammatic sketch showing another view of the conventional bump-on-capture pad flipchip interconnection, in a sectional view perpendicular to the plane of the package substrate surface.
Figure 3:
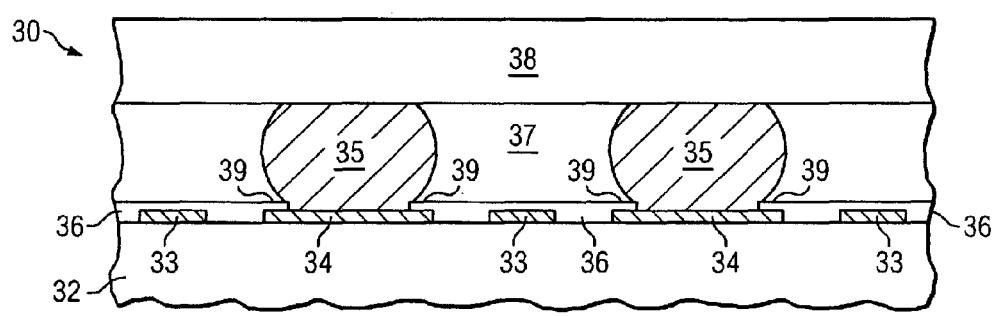
FIG. 3 is a diagrammatic sketch showing a portion of another conventional bump-on-capture pad flipchip interconnection, in a sectional view perpendicular to the plane of the package substrate surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 4:
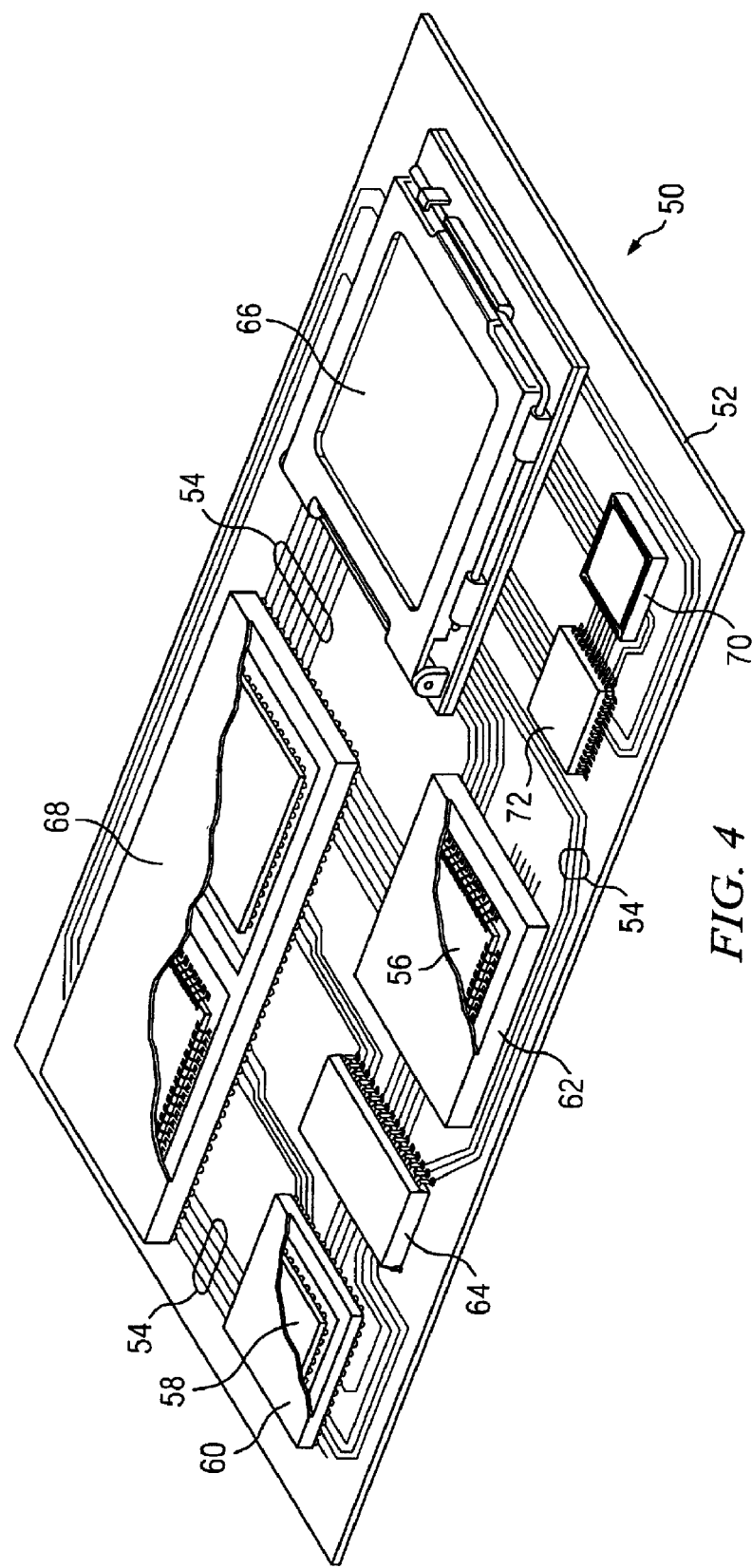
FIG. 4 illustrates a PCB with different types of packages mounted to its surface.

FIG. 4 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 4 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 4, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 5A:
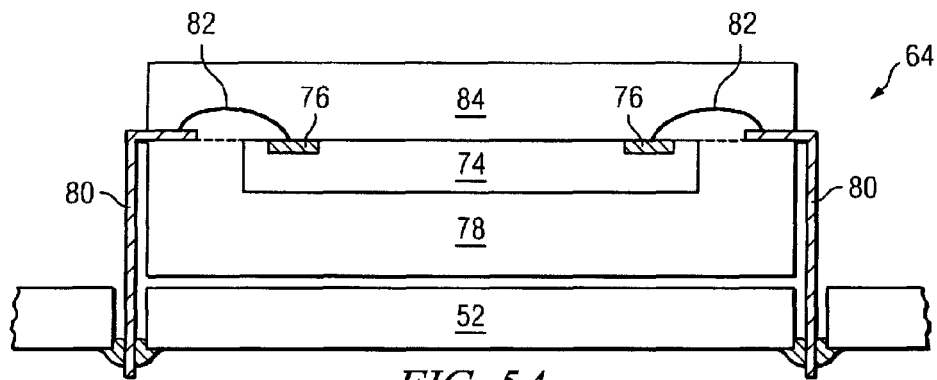
FIGS. 5A-5C illustrate further detail of the representative semiconductor packages mounted to the PCB.
Figure 5B:
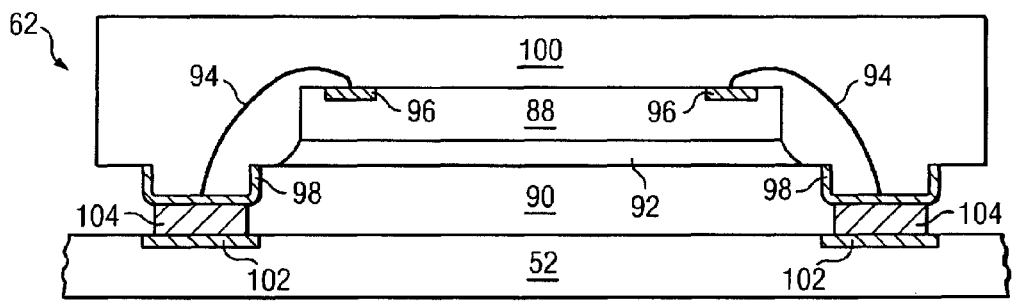
Figure 5C:
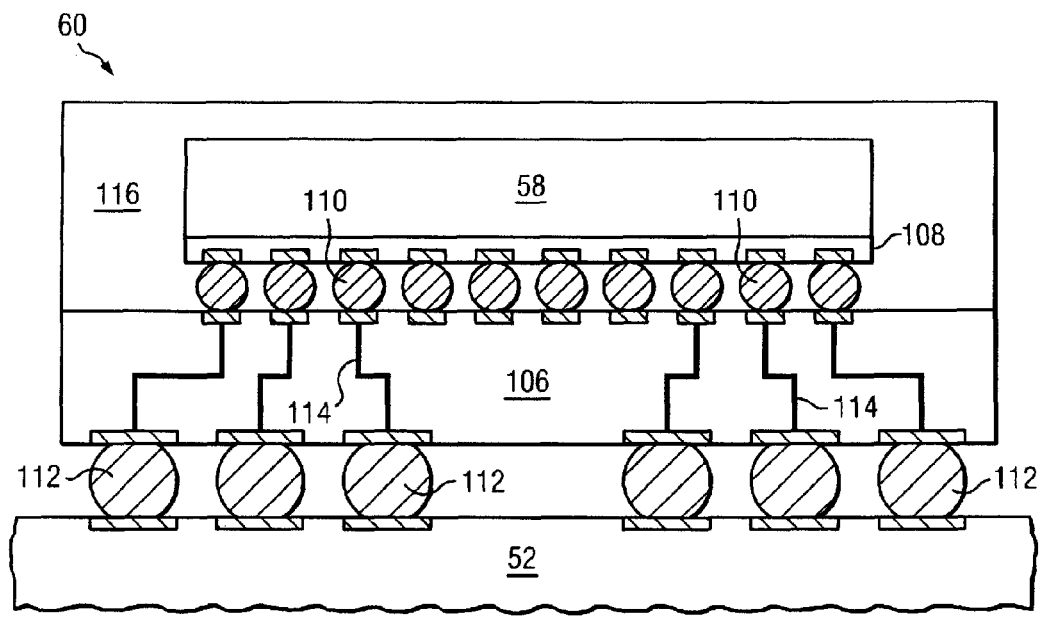

FIGS. 5A-5C show exemplary semiconductor packages. FIG. 5A illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 5B illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 5C, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 6:
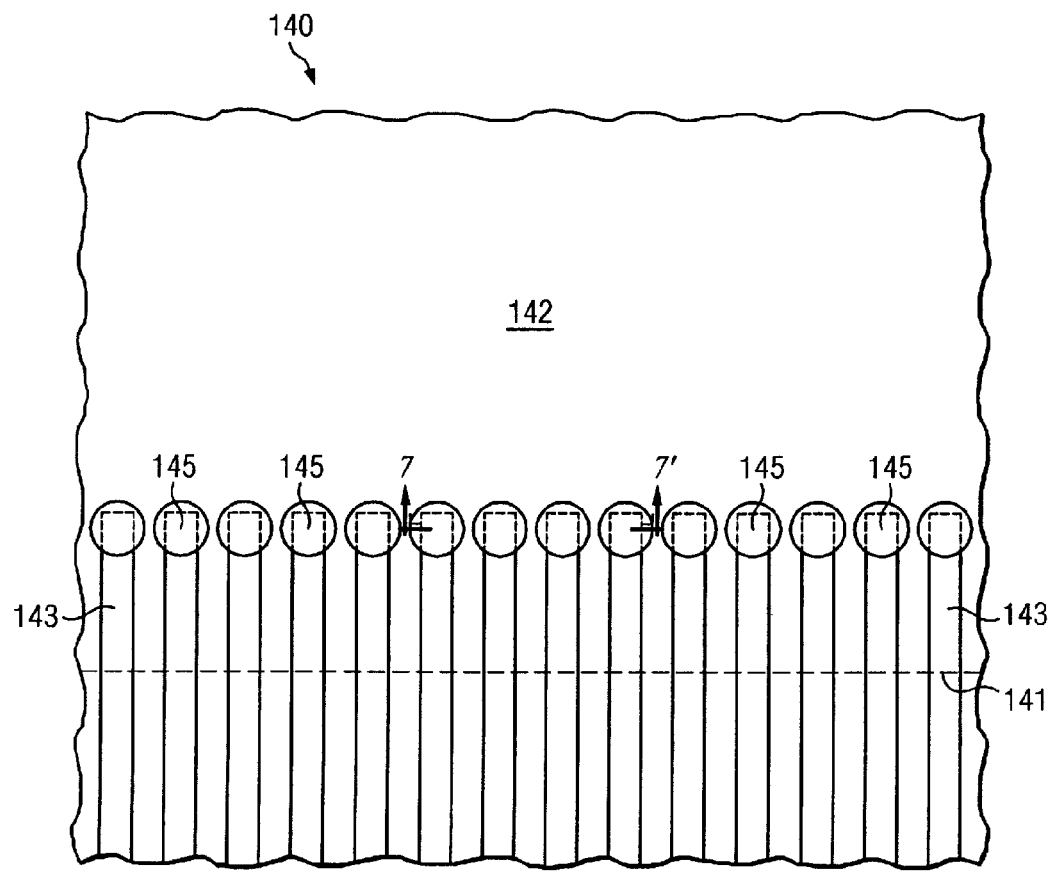
FIG. 6 is a diagrammatic sketch of a portion of an embodiment of a BOL flipchip interconnection, in a sectional view parallel to the plane of the package substrate surface.
Figure 7:
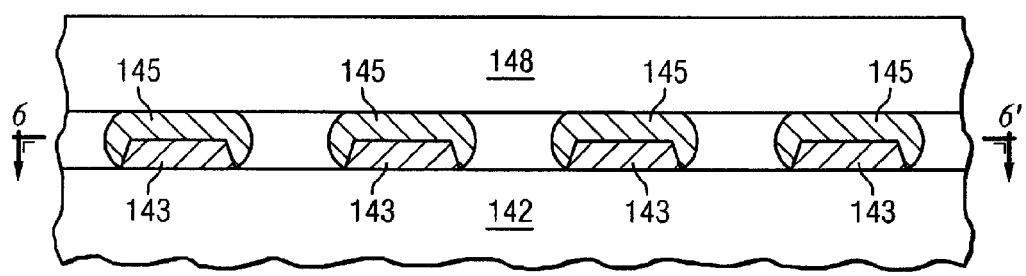
FIG. 7 is a diagrammatic sketch showing a portion of an embodiment of a BOL flipchip interconnection as in FIG. 6, in a sectional view perpendicular to the plane of the package substrate surface.
Figure 8:
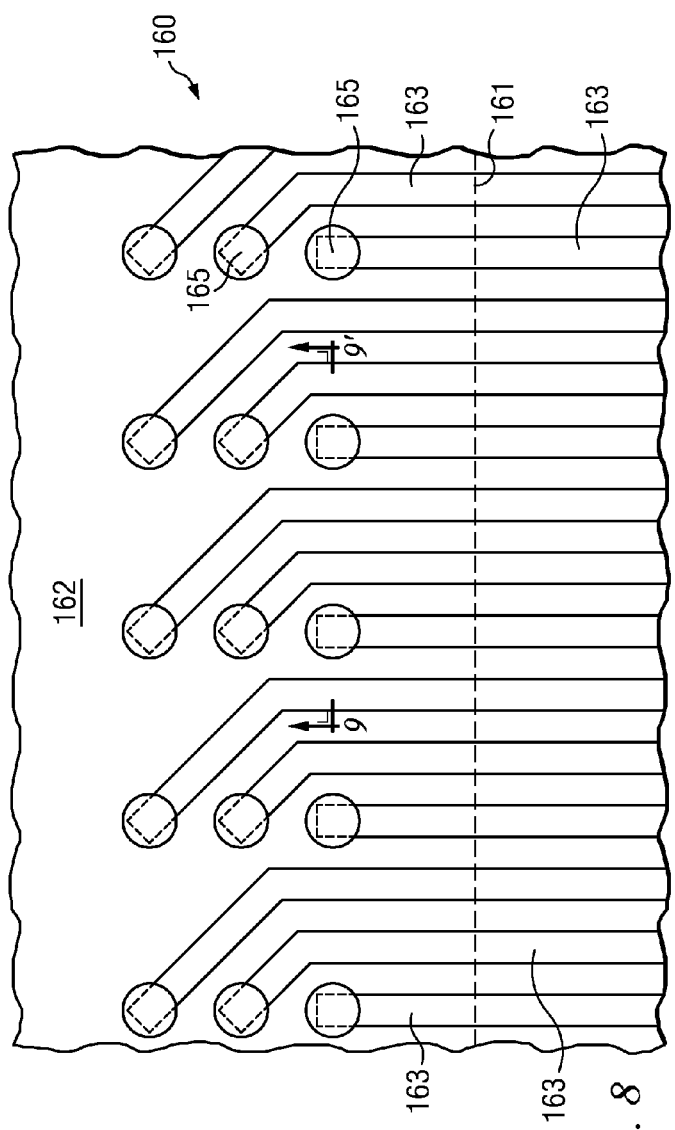
FIG. 8 is a diagrammatic sketch of a portion of another embodiment of a BOL flipchip interconnection, in a sectional view parallel to the plane of the package substrate surface.
Figure 9:
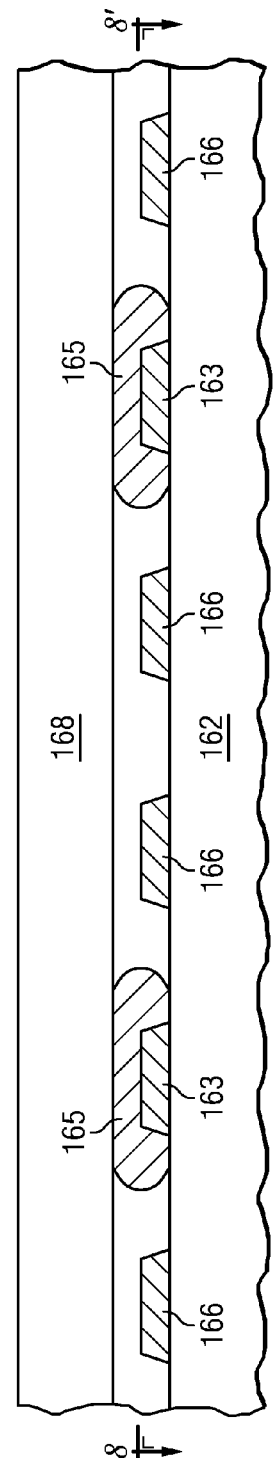
FIG. 9 is a diagrammatic sketch showing a portion of an embodiment of a BOL flipchip interconnection as in FIG. 8, in a sectional view perpendicular to the plane of the package substrate surface.

FIGS. 6 and 7 each show, in relation to FIGS. 4 and 5A-5C, a portion of a bump-on-lead (BOL) flipchip interconnection, in a diagrammatic partial sectional view taken in a plane parallel to the substrate surface, along the lines 7-7' and 6-6' in FIGS. 6 and 7, respectively. Certain features are shown as if transparent. The interconnection is achieved by mating the bumps directly onto respective narrow leads or traces on the substrate and, accordingly, this is referred to herein as a BOL interconnect. Solder mask materials typically cannot be resolved at such fine geometries and no solder mask is used. Instead the function of confining molten solder flow is accomplished without a solder mask in the course of the assembly process. FIG. 7 shows a partial sectional view of a package as in FIG. 6, taken in a plane perpendicular to the plane of the package substrate surface, along the line 7-7' in FIG. 6. FIG. 8 shows a partial sectional view of a package as in FIG. 9, taken in a plane perpendicular to the plane of the package substrate surface, along the line 8-8' in FIG. 9. FIG. 9 shows a partial sectional view of a package as in FIG. 8, taken in a plane perpendicular to the plane of the package substrate surface, along the line 9-9' in FIG. 8.

Escape routing patterns for BOL substrates are shown by way of example in FIGS. 6 and 8. In FIG. 6, arranged for a die on which the die attach pads for the interconnect balls are in a row near the die perimeter, bumps 145 are mated onto corresponding interconnect sites on escape traces 143 in a row near the edge of the die footprint, indicated by the broken line 141. In FIG. 8, arranged for a die on which the die attach pads are in an array of parallel rows near the die perimeter, bumps 165 are mated onto corresponding interconnect sites on escape traces 163 in a complementary array near the edge of the die footprint, indicated by the broken line 161.

As FIGS. 6 and 8 illustrate, the routing density achievable using BOL interconnect can equal the finest trace pitch offered by the substrate technology. In the specific case illustrated, this constitutes a routing density which is approximately 90% higher than is achieved in a bump-on-capture pad arrangement. In the perimeter row embodiments of BOL, e.g., FIG. 6, the bumps are placed at a fine pitch, which can equal the finest trace pitch of substrate 140. The arrangement poses a challenge for the assembly process, because the bumping and bonding pitch must be very fine. In the perimeter array version of BOL, the bumps are arranged on an area array, providing greater space for a larger bumping and bonding pitch, and relieving the technological challenges for the assembly process, as shown in FIG. 8. Even in the array embodiments, the routing traces on substrate 140 are at the same effective pitch as in the perimeter row arrangement, and an arrangement as in FIG. 8 relieves the burden of fine pitch bumping and bonding without sacrificing the fine escape routing pitch advantage.

Referring particularly now to FIGS. 6 and 7, leads 143 are formed by patterning a metal layer on a die attach surface of a substrate dielectric layer 142. The electrical interconnection of die 148 is made by joining bumps 145 on the die directly onto leads 143. No capture pads are required and, in embodiments as in FIGS. 6 and 7, no solder mask is required; the process is described in detail below.

The capture pads typically are about the same width or diameter as the bumps, and are typically two to four times as wide as the trace or lead width. As will be appreciated, some variation in the width of leads is expected. As used herein, a variation in trace width of as much as 120% of the nominal or trace design rule width does not constitute a capture pad, and BOL interconnection includes bumps formed on such wider portions of leads.

Similarly, referring to FIGS. 8 and 9, leads 163 are formed by patterning a metal layer on a die attach surface of dielectric layer 162 of substrate 160. The signal escape traces lead across the die edge location, indicated by the broken line 161, and away from the die footprint. The electrical interconnection of die 168 is made by joining bumps 165 on the die directly onto leads 163. Certain of the escape traces, e.g., escape trace 166, leading across the die edge location from interconnect sites in rows toward the interior of the die footprint, pass between bumps 165 on more peripheral rows of interconnect sites. No capture pads are required and, in embodiments as in FIGS. 8 and 9, no solder mask is required; the process is described in detail below.

As FIGS. 6 and 8 illustrate, BOL interconnect can provide a significantly higher signal trace escape routing density. Also, as FIGS. 6 and 8 illustrate, the BOL interconnect does not require use of a solder mask to define the solder contour at the interconnect site.

The BOL interconnection structure of embodiments such as are shown by way of example in FIGS. 6, 7, 8, and 9 can be produced by any of several methods, not requiring a solder mask. In general, interconnect bumps (typically solder bumps) are affixed onto interconnect pads on the active side of the die. A die attach surface of the substrate (termed the "upper" surface) has an upper metal layer patterned to provide the traces as appropriate for interconnection with the arrangement of bumps on the particular die. Because no capture pads are required, the patterned traces or leads need only route through sites corresponding to a pattern complementary to the arrangement of bumps on the die. In one embodiment, an encapsulating resin adhesive is employed to confine the solder flow during a melt phase of the interconnection process.

Figure 10:
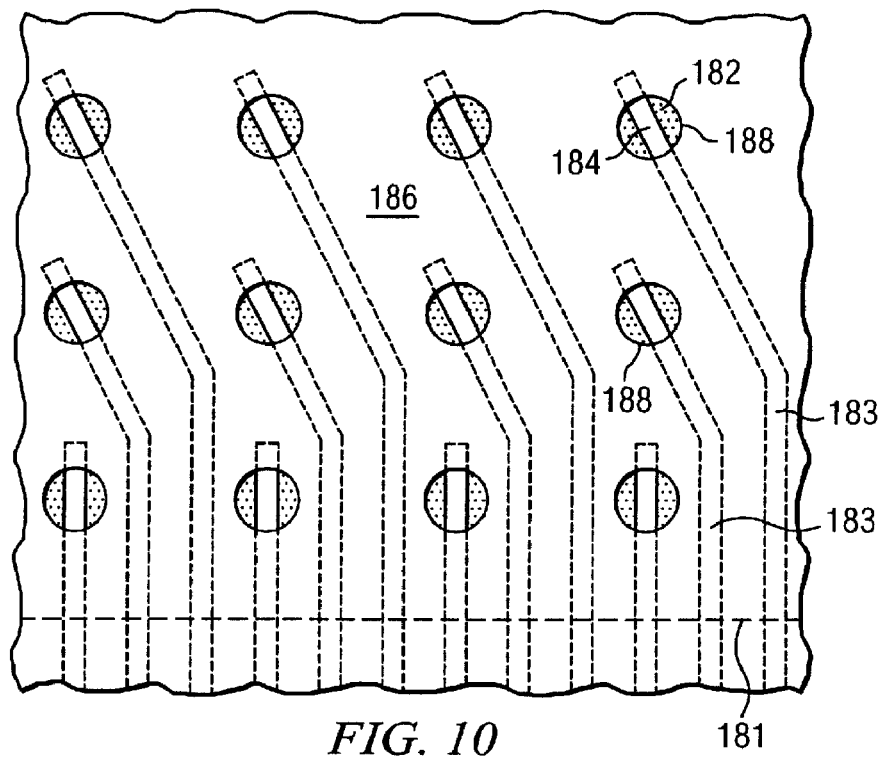
FIG. 10 is a diagrammatic sketch of a portion of another embodiment of a BOL flipchip interconnection, in a sectional view parallel to the plane of the package substrate surface.
Figure 11:
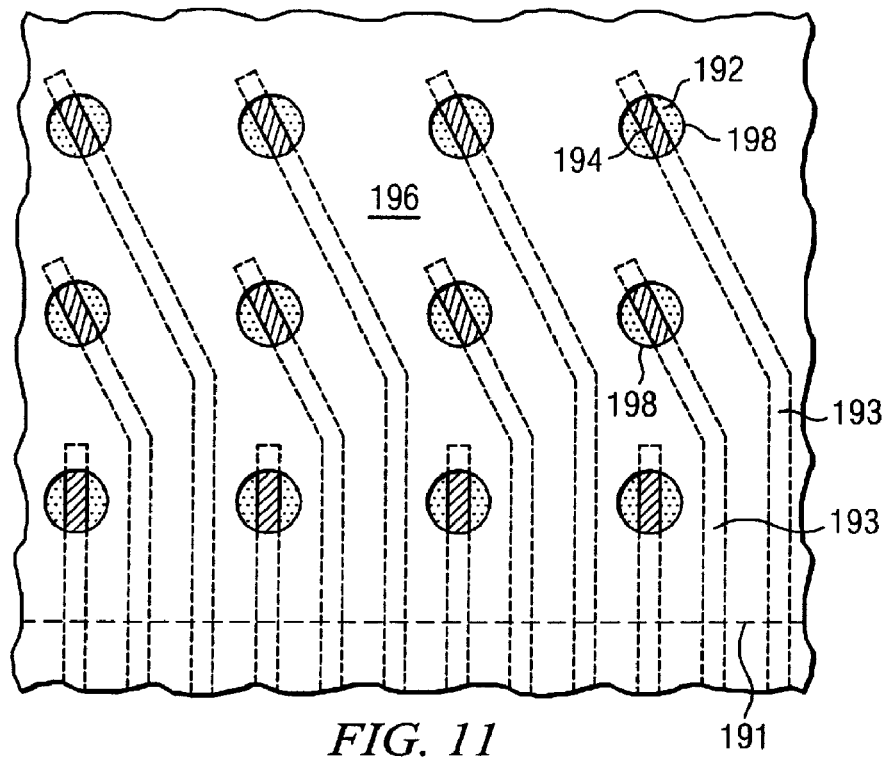
FIG. 11 is a diagrammatic sketch of a portion of another embodiment of a BOL flipchip interconnection, in a sectional view parallel to the plane of the package substrate surface.

FIGS. 10 and 11 show two examples of a portion of a BOL flipchip interconnection in a diagrammatic sectional view taken in a plane parallel to the substrate surface. Certain features are shown as if transparent. A solder mask is provided, which may have a nominal mask opening diameter in the range about 80 μm to 90 μm. Solder mask materials can be resolved at such pitches and, particularly, substrates can be made comparatively inexpensively with solder masks having 90 μm openings and having alignment tolerances plus or minus 25 μm. In some embodiments laminate substrates (such as four metal layer laminates), made according to standard design rules, are used. In the embodiments of FIGS. 10 and 11, for example, the traces may be at approximately 90 μm pitch and the interconnection sites may be in a 170 μm area array, providing an effective escape pitch approximately 90 μm across the edge of the die footprint, indicated by the broken lines 181 and 191.

In embodiments as in FIGS. 10 and 11, a no-flow underfill is not required; a capillary underfill can be employed.

In embodiments as in FIG. 10 the interconnection is achieved by mating the bumps directly onto an interconnect site 184 on a narrow lead or trace 183 patterned on a dielectric layer on the die attach surface of substrate 182; there is no pad, and solder mask 186 serves to limit flow of solder within the bounds of mask openings 188, preventing solder flow away from the interconnect site along the solder-wettable lead. The solder mask may additionally confine flow of molten solder between leads, or this may be accomplished in the course of the assembly process.

In embodiments as in FIG. 11, as in FIG. 10, there are no interconnect pads. Narrow leads or traces 193 patterned on a dielectric layer on the die attach surface of substrate 192. Solder paste is provided at interconnect sites 194 on leads 193, to provide a fusible medium for the interconnect. The openings 198 in solder mask 196 serve to define the paste. The paste is dispensed, for example, by a standard printing process, then is reflowed, and then may be coined if necessary to provide uniform surfaces to meet the balls. The solder paste can be applied in the course of assembly using a substrate as described above with reference to FIG. 10; or, a substrate may be provided with paste suitably patterned prior to assembly. Other approaches to applying solder selectively to the interconnect sites may be employed in the solder-on-lead embodiments, including electroless plating and electroplating techniques. The solder-on-lead configuration provides additional solder volume for the interconnect, and can accordingly provide higher product yield, and can also provide a higher die standoff.

Accordingly, in some embodiments the solder-on-lead configuration is employed for interconnection of a die having high-melting temperature solder bumps, such as a high-lead solder, used for interconnection with ceramic substrates, onto an organic substrate. The solder paste can be selected to have a melting temperature low enough that the organic substrate is not damaged during reflow. To form the interconnect in such embodiments, the high-melting interconnect bumps are contacted with the solder-on-lead sites, and the remelt fuses the solder-on-lead to the bumps. Where a non-collapsible bump is used, together with a solder-on-lead process, no preapplied adhesive is required, as the displacement or flow of the solder is limited by the fact that only a small quantity of solder is present at each interconnect, and the non-collapsible bump prevents collapse of the assembly.

In other embodiments the solder-on-lead configuration is employed for interconnection of a die having eutectic solder bumps.

Figure 12A:
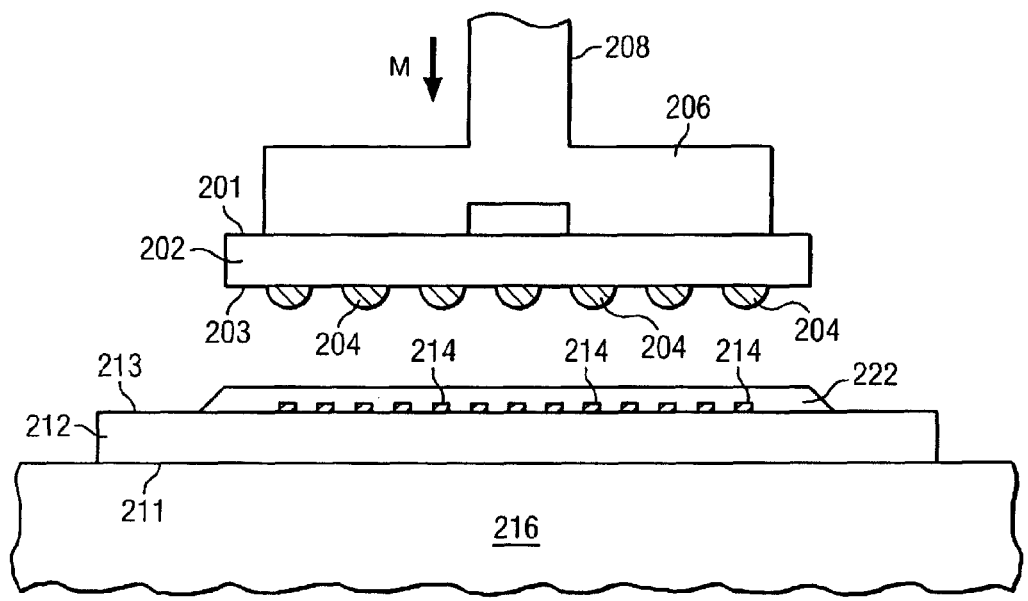
FIGS. 12A-12C are diagrammatic sketches in a sectional view illustrating steps in a process for making the BOL flipchip interconnection.
Figure 12B:
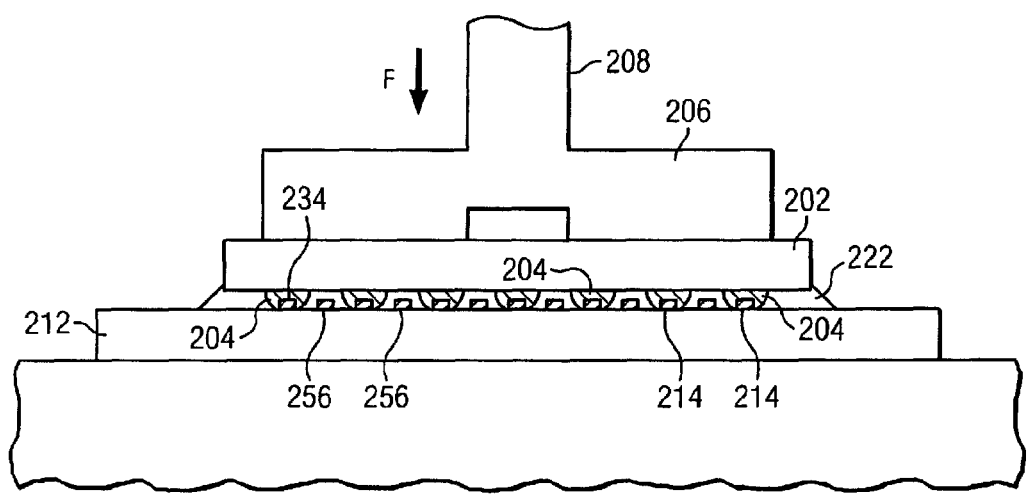
Figure 12C:
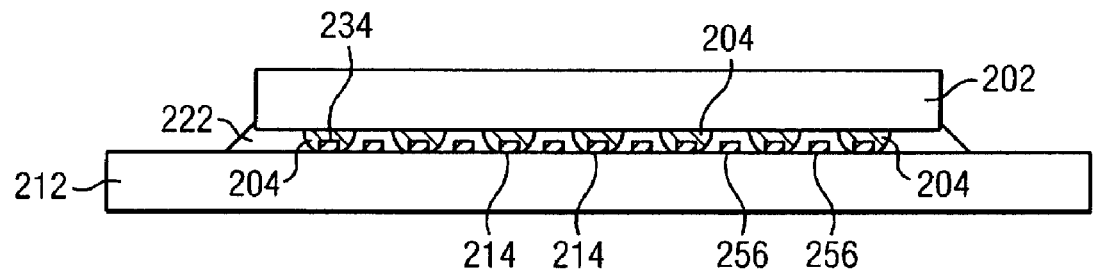

One embodiment for making a BOL interconnection is shown diagrammatically in FIGS. 12A-12C. A substrate 212 has at least one dielectric layer and having a metal layer on die attach surface 213, the metal layer being patterned to provide circuitry, particularly traces or leads 214 having sites for interconnection, on the die attach surface. Substrate 212 is supported, for example, on a carrier or stage 216, with a substrate surface 211 opposite die attach surface 213 facing the support. A quantity of encapsulating resin 222 is dispensed over die attach surface 213 of the substrate, covering at least the interconnect sites on leads 214. A die 202 is provided, having bumps 204 attached to die pads on active side 203. The bumps include a fusible material which contacts the mating surfaces of the leads. A pick-and-place tool 208 including chuck 206 picks up the die by contact of chuck 206 with backside 201 of the die. Using the pick-and-place tool, the die is positioned facing the substrate with the active side of the die toward the die attach surface of the substrate, as shown in FIG. 12A. The die and substrate are aligned and moved one toward the other, as shown by arrow M, so that bumps 204 contact the corresponding interconnect sites on traces or leads 214 on the substrate. A force indicated by arrow F is applied to press bumps 204 onto mating surfaces 234 at the interconnect sites on leads 214, as shown in FIG. 12B. The force must be sufficient at least to displace adhesive 222 from between the bumps and mating surfaces at the interconnect sites on leads 256. The bumps may be deformed by the force, breaking the oxide film on the contacting surface of the bumps and/or on the mating surface of leads. The deformation of the bumps may result in the fusible material of the bumps being pressed onto the top and over the edges of the lead. The adhesive 222 is cured at least partially, for example, by heating to a selected temperature. At this stage, the adhesive need only be partially cured, that is, only to an extent sufficient subsequently to prevent flow of molten solder along an interface between the adhesive and conductive traces. The fusible material of bumps 204 is melted and then is re-solidified, forming a metallurgical interconnection between bump 204 and lead 214, and the adhesive curing is completed, to complete the die mount and to secure the electrical interconnection at the mating surface (now an interconnect interface) 234, as shown in FIG. 12C. In the plane of the sectional view shown in FIG. 12C, interconnection is formed between certain of the bumps 204 and corresponding interconnect sites on certain of the leads 214, as for example, in a configuration as in FIG. 8. Other leads 256 are interconnected at other localities, which would be visible in other sectional views. The arrangement achieves a comparatively high trace density. The curing of adhesive 222 may be completed prior to, or concurrently with, or following melting the solder. Typically, the adhesive is a thermally curable adhesive, and the extent of curing at any phase in the process is controlled by regulating the temperature. The components can be heated and cured by raising the temperature of the chuck on the pick and place tool, or by raising the temperature of the substrate support.

Figure 13A:
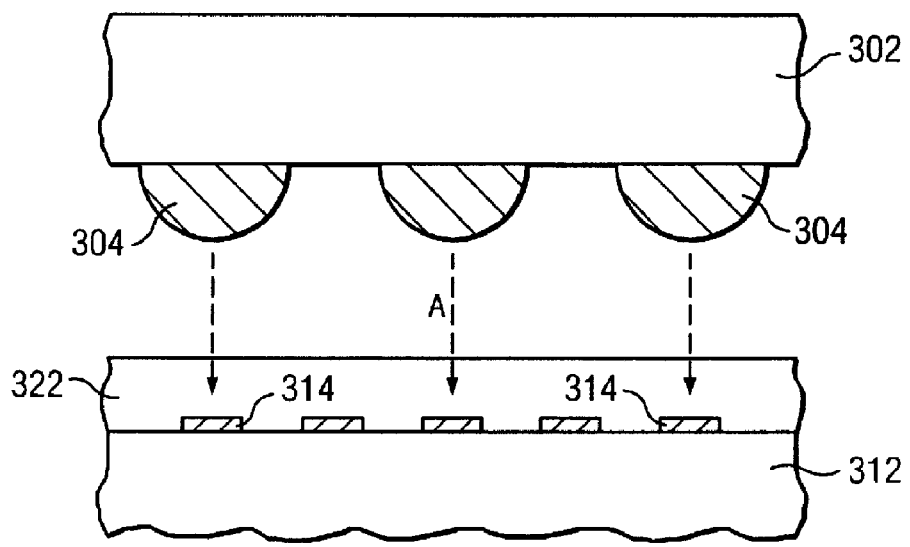
FIGS. 13A-13D are diagrammatic sketches in a sectional view illustrating steps in a process for making the BOL flipchip interconnection.
Figure 13B:
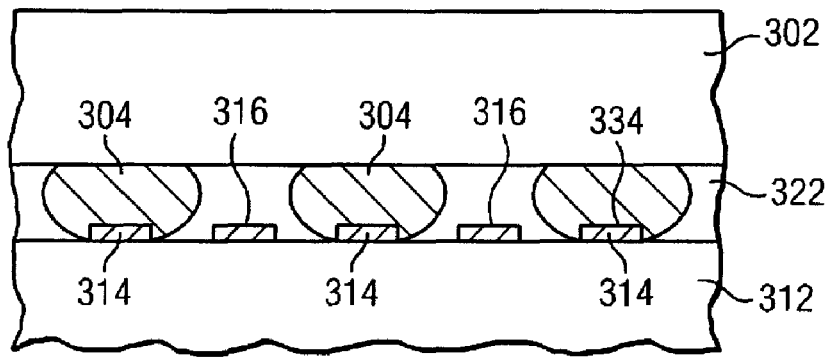
Figure 13C:
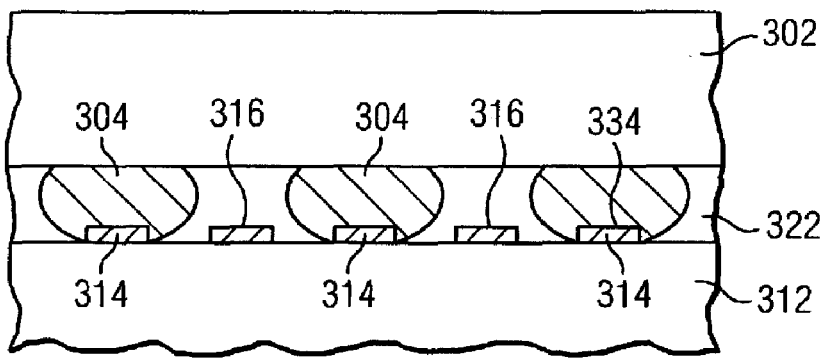
Figure 13D:
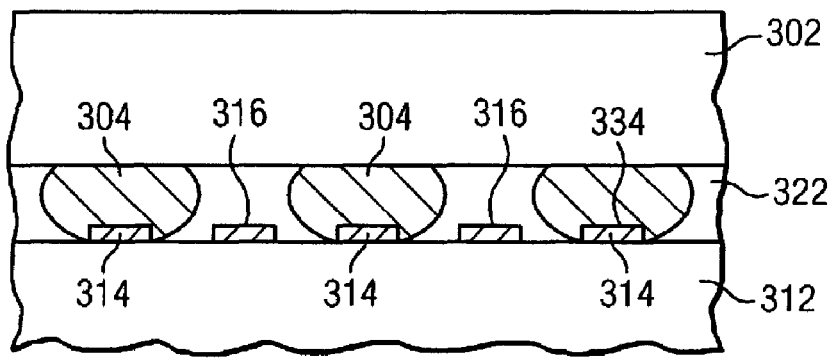

The process is shown in further detail in FIGS. 13A-13D. In FIG. 13A, substrate 312 is provided on a die attach surface with conductive (metal) traces 314, and interconnect sites on the traces are covered with adhesive 322. Die 302 is positioned in relation to substrate 312 such that the active side of the die faces the die attach side of the substrate, and is aligned, as indicated by arrows A, such that bumps 304 on the die are aligned with corresponding mating surfaces on traces 314. The die and the substrate are moved toward one another so that the bumps contact the respective mating surfaces on the traces. A force is applied to move bumps 304 and traces 314 against one another, displacing the adhesive as shown at 322 in FIG. 13B, and deforming the bumps onto mating surfaces 334 and over the edges of the traces. Deformation of the bumps on the traces breaks the oxide film on the contact surfaces of the bumps and the mating surfaces of the traces, establishing a good electrical connection, and deformation of the bumps over the edges of the traces helps establish a good temporary mechanical connection. As in the example of FIG. 12A-12C, the interconnect sites of certain of traces 316 are out of the plane of FIG. 13B. Heat is applied to partially cure adhesive 322 in FIG. 13C. Heat is applied to raise the temperature of the bumps sufficiently to cause the fusible material of the bumps to melt, as shown in FIG. 13D, to substantially (though not necessarily fully) complete the cure of adhesive 322 and completes the metallurgical interconnection of bumps 304 onto mating surfaces 334 at the interconnect sites on leads 314. The cured adhesive stabilizes the die mount.

In an alternative embodiment, the adhesive can be preapplied to the die surface, or at least to the bumps on the die surface, rather than to the substrate. The adhesive can, for example, be pooled in a reservoir, and the active side of the die can be dipped in the pool and removed, so that a quantity of the adhesive is carried on the bumps. By using a pick-and-place tool, the die is positioned facing a supported substrate with the active side of the die toward the die attach surface of the substrate, and the die and substrate are aligned and moved one toward the other so that the bumps contact the corresponding traces or leads on the substrate. Such a method is described in U.S. Pat. No. 6,780,682, Aug. 24, 2004, which is hereby incorporated by reference. The process of forcing, curing, and melting are carried out as described above.

Figure 14:
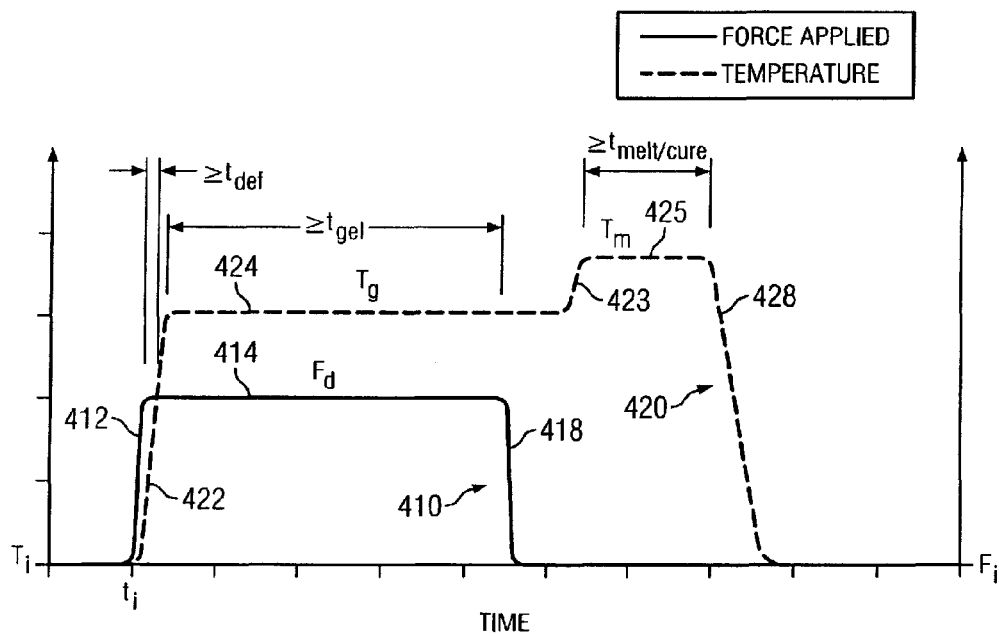
FIG. 14 is a diagrammatic sketch showing a force or temperature schedule for a process for making the BOL flipchip interconnection.

A force or temperature schedule for the process is shown diagrammatically by way of example in FIG. 14. The process may use force, or temperature, or both. In this chart, time runs from left to right on the horizontal axis. A force profile 410 is shown as a thick solid line, and a temperature profile 420 is shown as a dotted line. The temperature profile begins at a temperature in the range of 80-90° C. The force profile begins at essentially zero force. Beginning at an initial time $t_i$ the force is rapidly increased from $F_i$ to a displacement/deformation force $F_d$ during portion 412 and held at that force for a time during portion 414, as discussed below. The force $F_d$ is sufficient to displace the adhesive away from between the bumps and the mating surfaces of the leads. The force $F_d$ is sufficient to deform the fusible (lead-contacting) portion of the bumps onto the mating surface, breaking the oxide films and forming a good metal-to-metal (metallurgical) contact, and, in some embodiments, over the edges of the leads to establish a mechanical interlock of the bumps and the leads ("creep" deformation). The total amount of force required will depend upon the bump material and dimensions and upon the number of bumps.

The temperature is also rapidly increased from an initial temperature Ti to a gel temperature Tg during portion 422. The gel temperature Tg is a temperature sufficient to partially cure the adhesive to a "gel". The temperature ramps are set so that there is a short lag time $t_{def}$ following the moment when $F_d$ is reached and before Tg is reached, at least long enough to permit the elevated force to displace the adhesive and to deform the bumps before the partial cure of the adhesive commences. The assembly is held during portion 414 and 424 at the displacement/deformation pressure $F_d$ and at the gel temperature $T_g$ for a time $t_{gel}$ sufficient to effect the partial cure of the adhesive. The adhesive should become sufficiently firm that it can subsequently maintain a good bump profile during the solder remelt phase—that is, sufficiently firm to prevent undesirable displacement of the molten fusible material of the bump, or flow of the molten fusible material along the leads.

Once the adhesive has partially cured to a sufficient extent, the pressure may be ramped down rapidly during portion 418 to substantially no force or weight of the components. The temperature is then rapidly raised further during portion 423 to a temperature $T_m$ sufficient to remelt the fusible portions (solder) of the bumps, and the assembly is held during portion 425 at the remelt temperature $T_m$ for a time $t_{melt/cure}$ at least sufficient to fully form the solder remelt on the traces, and preferably sufficient to substantially, though not necessarily fully, cure the adhesive. Then the temperature is ramped down during portion 428 to the initial temperature $T_i$, and eventually to ambient. The process outlined in FIG. 14 can run its course over a time period of 5-10 seconds.

The adhesive in embodiments as in FIG. 14 may be referred to as a "no-flow underfill". In some approaches to flipchip interconnection, the metallurgical interconnection is formed first, and then an underfill material is flowed into the space between the die and the substrate. The "no-flow underfill" is applied before the die and the substrate are brought together, and the no-flow underfill is displaced by the approach of the bumps onto the leads, and by the opposed surfaces of the die and the substrate. The adhesive for the no-flow underfill adhesive is preferably a fast-gelling adhesive—that is, a material that gels sufficiently at the gel temperature in a time period in the order of 1-2 seconds. The materials for the no-flow underfill adhesive include, for example, non-conductive pastes.

Alternative bump structures may be employed in the BOL interconnects. Particularly, for example, so-called composite solder bumps may be used. Composite solder bumps have at least two bump portions, made of different bump materials, including one which is collapsible under reflow conditions, and one which is substantially non-collapsible under reflow conditions. The non-collapsible portion is attached to the interconnect site on the die. Typical materials for the non-collapsible portion include various solders having a high lead content. The collapsible portion is joined to the non-collapsible portion, and it is the collapsible portion that makes the connection with the lead. Typical materials for the collapsible portion of the composite bump include eutectic solders.

Figure 15:
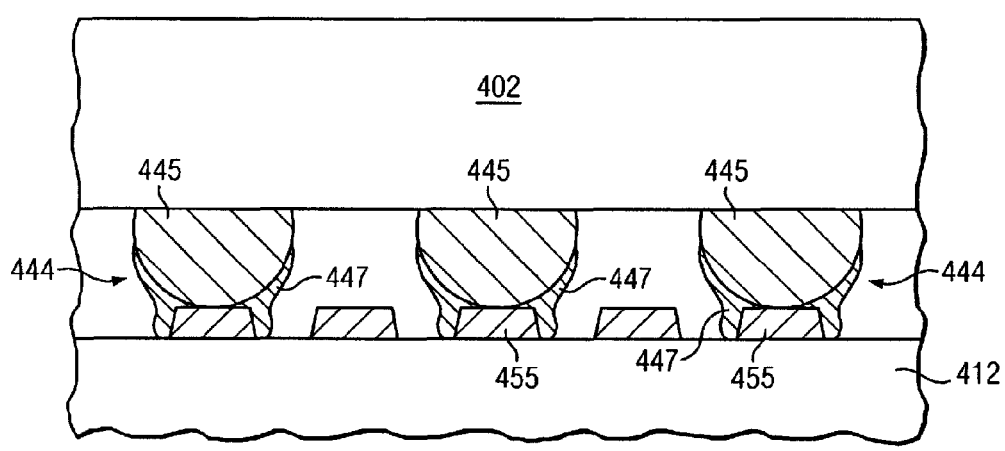
FIG. 15 is a diagrammatic sketch in a sectional view showing a BOL flipchip interconnection having composite bumps.

An example of a BOL interconnect employing a composite bump is shown in a diagrammatic sectional view in FIG. 15. Die 402 is provided on die pads in the active side of the die with composite bumps 444 that include non-collapsible portion 445 and collapsible portion 447. The collapsible portion may be, for example, a eutectic solder or a relatively low temperature melt solder. The collapsible portion contacts the mating surface of the lead and, where deformation of the fusible portion of the bump over lead 455 is desired, the collapsible portion of the bump is deformable under the conditions of force employed. The non-collapsible portion may be, for example, a solder having a high lead content. The non-collapsible portion does not deform when the die is moved under pressure against substrate 412 during processing, and does not melt during the reflow phase of the process. Accordingly the non-collapsible portion can be dimensioned to provide a standoff distance between the active surface of the die and the die attach surface of the substrate.

As may be appreciated, the bumps in embodiments as shown in, for example, FIGS. 6, 7, 8, and 9 need not necessarily be fully collapsible bumps. The structures shown in those FIGs. may alternatively be made using composite bumps, or using a solder-on-lead method, as described above.

Figure 16A:
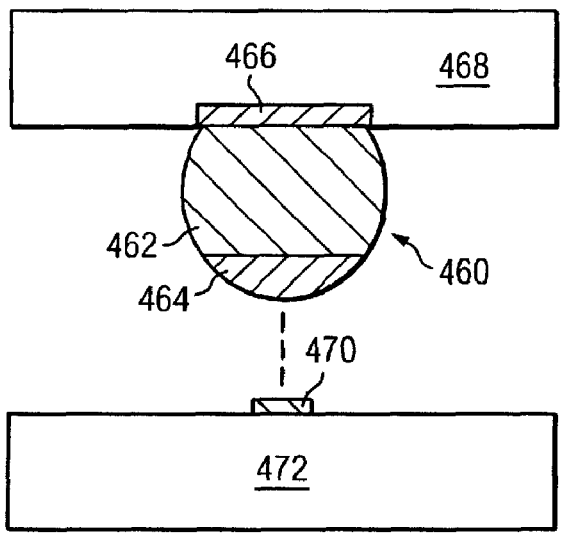
FIGS. 16A-16B illustrate another embodiment of the BOL flipchip interconnect with composite bumps.
Figure 16B:
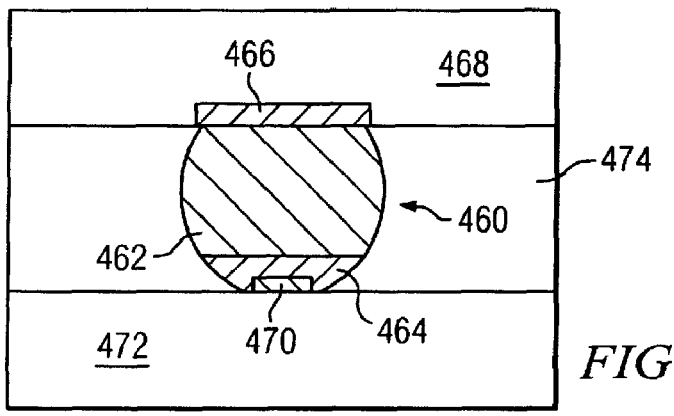

Another embodiment of the BOL interconnect using a composite bump 460 is shown in FIGS. 16A-16B. Composite bump 460 has a non-fusible portion 462 and fusible portion 464. The non-fusible portion 462 makes up a larger part of composite bump 460 than the fusible portion 464. The non-fusible portion 462 is fixed to contact pad or interconnect site 466 of semiconductor die 468. The fusible portion 464 is positioned over lead or trace 470 on substrate 472 in FIG. 16A and brought into physical contact with lead 470 for reflow. The fusible portion 464 collapses around lead 470 upon reflow with heat or application of pressure, as shown in FIG. 16B. The non-fusible portion 462 does not melt or deform during reflow and retains its form and shape. The non-fusible portion 462 can be dimensioned to provide a standoff distance between semiconductor die 468 and substrate 472. A finish such as Cu organic solderability preservative (OSP) can be applied to substrate 472. A mold underfill material 474 is deposited between semiconductor die 468 and substrate 472 to fill the gap between the die and substrate.

The non-fusible portion 462 and fusible portion 464 of composite bump 460 are made of different bump material. The non-fusible portion 462 can be Au, Cu, Ni, high-lead solder, or lead-tin alloy. The fusible portion 464 can be Sn, lead-free alloy, Sn—Ag alloy, Sn—Ag—Cu alloy, Sn—Ag-indium (In) alloy, eutectic solder, or other tin alloys with Ag, Cu, or Pb.

During a reflow process, a large number (e.g., thousands) of composite bumps 460 on semiconductor die 468 are attached to interconnect sites on trace 470 of substrate 472. Some of the bumps 460 may fail to properly connect to substrate 472, particularly if die 468 is warped. Recall that composite bump 460 is larger than trace 470. With a proper force applied, the fusible portion 464 deforms or extrudes around trace 470 and mechanically locks composite bump 460 to substrate 472. The mechanical interlock is formed by nature of the fusible portion 464 being softer than trace 470. The mechanical interlock between composite bump 460 and substrate 472 holds the bump to the substrate during reflow, i.e., the bump and substrate do not lose contact. Accordingly, composite bump 460 mating to substrate 472 reduces the bump connect failures.

Figure 17A:
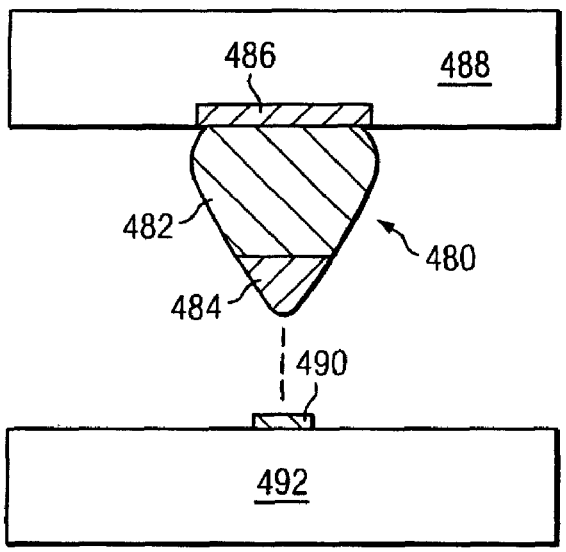
FIGS. 17A-17D illustrate another embodiment of the BOL flipchip interconnect with tapered composite bumps.
Figure 17B:
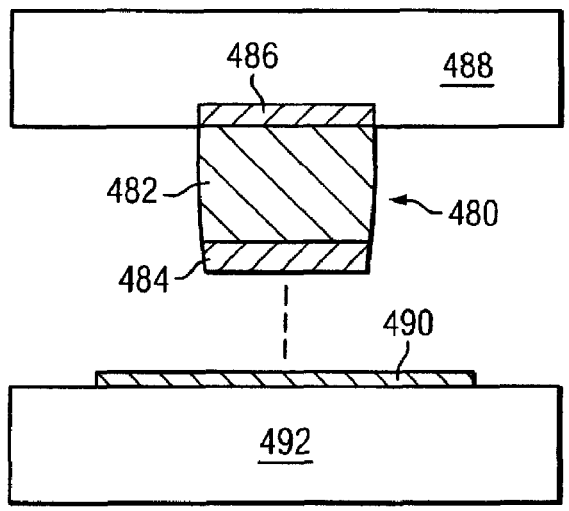
Figure 17C:
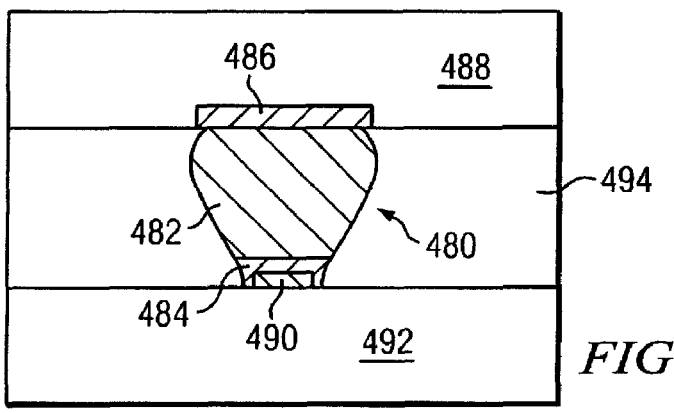
Figure 17D:
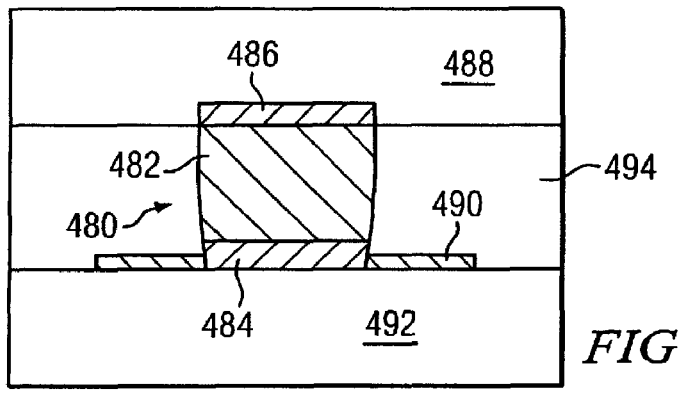

In another embodiment of the BOL interconnect, composite bump 480 is tapered, as shown in FIGS. 17A-17D. Composite bump 480 has a non-fusible portion 482 and fusible portion 484. The non-fusible portion 482 makes up a larger part of composite bump 480 than the fusible portion 484. The non-fusible portion 482 is fixed to contact pad or interconnect site 486 of semiconductor die 488. The fusible portion 484 is positioned over lead or trace 490 on substrate 492 and brought into physical contact with lead 490 for reflow. Composite bump 480 is tapered along trace 490, i.e., the composite bump has a wedge shape, longer along a length of trace 490 and narrower across trace 490. The tapered aspect of composite bump 480 occurs along the length of trace 490. The view in FIG. 17A shows the narrowing taper co-linear with trace 490. The view in FIG. 17B, normal to FIG. 17A, shows the longer aspect of the wedge-shaped composite bump 480. The fusible portion 484 collapses around lead 490 upon reflow with heat or application of pressure as shown in FIGS. 17C and 17D. The non-fusible portion 482 does not melt or deform during reflow and retains its form and shape. The non-fusible portion 482 can be dimensioned to provide a standoff distance between semiconductor die 488 and substrate 492. A finish such as Cu OSP can be applied to substrate 492. A mold underfill material 494 is deposited between semiconductor die 488 and substrate 492 to fill the gap between the die and substrate.

The non-fusible portion 482 and fusible portion 484 of composite bump 480 are made of different bump material. The non-fusible portion 482 can be Au, Cu, Ni, high-lead solder, or lead-tin alloy. The fusible portion 484 can be Sn, lead-free alloy, Sn—Ag alloy, Sn—Ag—Cu alloy, Sn—Ag-indium (In) alloy, eutectic solder, or other tin alloys with Ag, Cu, or Pb.

During a reflow process, a large number (e.g., thousands) of composite bumps 480 on semiconductor die 488 are attached to interconnect sites on trace 490 of substrate 492. Some of the bumps 480 may fail to properly connect to substrate 492, particularly if die 488 is warped. Recall that composite bump 480 is larger than trace 490. With a proper force applied, the fusible portion 484 deforms or extrudes around trace 490 and mechanically locks composite bump 480 to substrate 492. The mechanical interlock is formed by nature of the fusible portion 484 being softer than trace 490. The mechanical interlock between composite bump 480 and substrate 492 holds the bump to the substrate during reflow, i.e., the bump and substrate do not lose contact. Accordingly, composite bump 480 mating to substrate 492 reduces the bump connect failures.

Any stress induced by the interconnect between the die and substrate can result in damage or failure of the die. The die contains low dielectric constant (k) materials, which are susceptible to damage from thermally induced stress. The tapered composite bump 480 reduces interconnect stress on semiconductor die 488, which results in less damage to the low k materials and a lower failure rate of the die.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   providing a substrate;
   forming a plurality of traces on the substrate, each trace having an interconnect site with edges parallel to the trace from a plan view for increasing escape routing density; and
   forming a plurality of composite interconnects between the interconnect sites and a contact pad on the semiconductor die, each composite interconnect having a wedge shape with a tapered co-linear length along the trace longer than a width across the trace, each composite interconnect having a non-fusible portion connected to the contact pad on the semiconductor die and a fusible portion connected to the interconnect site on the substrate.

2. The method of claim 1, wherein the non-fusible portion of the composite interconnect includes gold, copper, nickel, lead solder, or lead-tin alloy.

3. The method of claim 1, wherein the fusible portion of the composite interconnect includes tin, lead-free alloy, tin-silver alloy, tin-silver-copper alloy, tin-silver-indium alloy, eutectic solder, or tin alloys with silver, copper, or lead.

4. The method of claim 1, wherein the tapered co-linear length of the composite interconnect reduces stress and damage to the semiconductor die.

5. The method of claim 1, further including depositing an underfill material between the semiconductor die and substrate.

6. The method of claim 1, further including forming a finish over the substrate.

7. A method of making a semiconductor device, comprising:
   providing a semiconductor die;
   providing a substrate having a trace with an interconnect site; and
   forming a composite interconnect between the interconnect site on the trace and a contact pad on the semiconductor die, the composite interconnect having a tapered co-linear length along the trace longer than a width across the trace, the composite interconnect having a non-fusible portion connected to the contact pad on the semiconductor die and a fusible portion connected to the interconnect site on the trace of the substrate.

8. The method of claim 7, wherein the non-fusible portion of the composite interconnect includes gold, copper, nickel, lead solder, or lead-tin alloy.

9. The method of claim 7, wherein the fusible portion of the composite interconnect includes tin, lead-free alloy, tin-silver alloy, tin-silver-copper alloy, tin-silver-indium alloy, eutectic solder, or tin alloys with silver, copper, or lead.

10. The method of claim 7, wherein the tapered co-linear length of the composite interconnect reduces stress and damage to the semiconductor die.

11. The method of claim 7, wherein a width of the interconnect site under the composite interconnect is no greater than a width of the trace away from the composite interconnect.

12. A method of making a semiconductor device, comprising:
providing a semiconductor die;
providing a substrate having a trace with an interconnect site, wherein the interconnect site has a width less than 1.2 times a width of the trace; and
forming a composite interconnect between the interconnect site on the trace and a contact pad on the semiconductor die, the composite interconnect having a non-fusible portion connected to the contact pad on the semiconductor die and a fusible portion connected to the interconnect site on the trace of the substrate.

13. A method of making a semiconductor device, comprising:
providing a semiconductor die;
providing a substrate having a trace;
forming a composite bump material over an interconnect site on the trace or a contact pad on the semiconductor die, the composite interconnect having a length along the trace longer than a width across the trace, the composite bump material having a fusible portion and a non-fusible portion; and
reflowing the composite bump material to form a composite interconnect between the interconnect site on the substrate and the contact pad on the semiconductor die.

14. The method of claim 13, wherein the non-fusible portion of the composite bump material includes gold, copper, nickel, lead solder, or lead-tin alloy.

15. The method of claim 13, wherein the fusible portion of the composite bump material includes tin, lead-free alloy, tin-silver alloy, tin-silver-copper alloy, tin-silver-indium alloy, eutectic solder, or tin alloys with silver, copper, or lead.

16. The method of claim 13, wherein the composite interconnect is tapered.

17. The method of claim 13, further including:
forming the fusible portion of the composite bump material adjacent to the interconnect site on the trace; and
forming the non-fusible portion of the composite bump material adjacent to the contact pad on the semiconductor die.

18. A semiconductor device, comprising:
a semiconductor die;
a substrate having a trace; and
a composite interconnect formed between an interconnect site on the trace and a contact pad on the semiconductor die, the composite interconnect having a length along the trace longer than a width across the trace, the composite interconnect having a non-fusible portion connected to the contact pad and fusible portion connected to the trace.

19. The semiconductor die of claim 18, wherein the non-fusible portion of the composite interconnect includes gold, copper, nickel, lead solder, or lead-tin alloy.

20. The semiconductor die of claim 18, wherein the fusible portion of the composite interconnect includes tin, lead-free alloy, tin-silver alloy, tin-silver-copper alloy, tin-silver-indium alloy, eutectic solder, or tin alloys with silver, copper, or lead.

21. The semiconductor die of claim 18, wherein the composite interconnect is tapered.

22. The semiconductor die of claim 18, wherein the fusible portion of the composite interconnect is adjacent to the interconnect site on the trace, and the non-fusible portion of the composite interconnect is adjacent to the contact pad on the semiconductor die.

23. The semiconductor die of claim 18, wherein the interconnect site has edges parallel to the trace.

24. A method of making a semiconductor device, comprising:
providing a semiconductor die;
providing a substrate having a trace with an interconnect site; and
forming a composite interconnect between the interconnect site on the trace and a contact pad on the semiconductor die, the composite interconnect having a non-fusible portion connected to the contact pad on the semiconductor die and a fusible portion connected to the interconnect site on the trace of the substrate, the interconnect sites having parallel edges with a width less than a width of the composite interconnect and the composite interconnect having a tapered co-linear length along the trace longer than a width across the trace.

25. The method of claim 24, wherein the composite interconnect has a pitch as determined by minimum spacing between adjacent conductive traces that can be achieved on the substrate.

26. The method of claim 24, wherein the tapered co-linear length of the composite interconnect reduces stress and damage to the semiconductor die.

27. The method of claim 24, wherein the non-fusible portion of the composite interconnect includes gold, copper, nickel, lead solder, or lead-tin alloy.

28. The method of claim 24, wherein the fusible portion of the composite interconnect includes tin, lead-free alloy, tin-silver alloy, tin-silver-copper alloy, tin-silver-indium alloy, eutectic solder, or tin alloys with silver, copper, or lead.

29. The method of claim 24, wherein a width of the interconnect site under the composite interconnect is no greater than a width of the trace away from the composite interconnect.

* * * * *